United States Patent [19]

Iwasawa et al.

[11] Patent Number: 4,904,153

[45] Date of Patent: Feb. 27, 1990

[54] TRANSPORTING ROBOT FOR SEMICONDUCTOR WAFERS

[75] Inventors: Yoshiyuki Iwasawa; Tsutomu Ishida; Hiroshi Harada; Shintaro Kobayashi; Kenji Okamoto, all of Tokyo; Takashi Matsumoto, Ise; Kiwamu Yamamoto, Ise; Toshio Takasu, Ise, all of Japan

[73] Assignees: Shimizu Construction Co., Ltd.; Shinko Electric Co., Ltd., both of Tokyo, Japan

[21] Appl. No.: 119,839

[22] Filed: Nov. 12, 1987

[30] Foreign Application Priority Data

Nov. 20, 1986 [JP] Japan .................................. 61-277056
Dec. 3, 1986 [JP] Japan .................................. 61-288356
Dec. 3, 1986 [JP] Japan .................................. 61-288357

[51] Int. Cl.⁴ .............................................. B25J 15/08
[52] U.S. Cl. ....................................... 414/735; 15/301;
15/312 R; 98/115.3; 104/139; 294/119.1;
294/902; 414/741; 901/6; 901/17; 901/39;
901/49
[58] Field of Search ................. 414/730, 735, 751, 753,
414/741; 901/1, 6, 17, 39, 49, 38; 294/99.1,
119.1, 902, 16, 3; 104/139; 15/301, 312 R, 312
A; 98/115.3

[56] References Cited

U.S. PATENT DOCUMENTS

| | | | |
|---|---|---|---|
| 1,049,150 | 12/1912 | Robail ...................... | 294/119.1 X |
| 2,735,713 | 2/1956 | Blakeley ..................... | 294/119.1 |
| 3,968,885 | 7/1976 | Hassan et al. .................. | 198/346.2 |
| 4,336,926 | 6/1982 | Inagaki et al. .................. | 414/741 X |
| 4,353,537 | 10/1982 | Koufos ........................ | 294/902 |
| 4,502,830 | 3/1985 | Inaba et al. .................... | 901/17 X |
| 4,507,046 | 3/1985 | Sugimoto et al. ................ | 414/735 |
| 4,591,199 | 5/1986 | Zajac ........................... | 294/119.1 |
| 4,660,464 | 4/1987 | Tanaka ......................... | 104/139 X |
| 4,723,799 | 2/1988 | Wollman et al. ................. | 294/16 |

FOREIGN PATENT DOCUMENTS 138473 4/1985 European Pat. Off. .
94338 7/1985 European Pat. Off. .
970441 9/1964 United Kingdom .

OTHER PUBLICATIONS

*Reduction of Labor and Automation*, Jun., 1985, pp. 43–47.

*Primary Examiner*—Robert J. Spar
*Assistant Examiner*—Donald W. Underwood
*Attorney, Agent, or Firm*—Scully, Scott, Murphy & Presser

[57] ABSTRACT

There is disclosed a robot used in a clean room and adapted to transport a wafer cassette containing semiconductor wafers. The robot includes: a guide rail disposed in the clean room; a robot body slidably connected to the guide rail for movement along the guide rail; and a first drive mechanism for driving the robot body along the guide rail. The robot body includes: a clamping hand for releasably clamping the wafer cassette; an arm assembly, extending between the guide rail and the clamping hand, for controlling the position of the clamping hand; and a wrist assembly, interposed between the arm assembly and the clamping hand, for adjusting the orientation of the clamping hand. The wrist assembly includes: a wrist frame connected via a horizontal pivot to the arm assembly for upward and downward movement, the wrist frame rotatably supporting the clamping hand for turning about an axis perpendicular to the horizontal pivot; a second drive mechanism for pivoting the wrist frame relative to the arm assembly; and a third drive mechanism for turning the clamping hand relative to the wrist frame.

11 Claims, 11 Drawing Sheets

TRANSPORTING ROBOT FOR SEMICONDUCTOR WAFERS

BACKGROUND OF THE INVENTION

This invention relates to a robot used in clean rooms in order to transport semiconductor wafers contained in a wafer cassette and to load and unload the same automatically to and from semiconductor processing apparatuses.

In the fabrication process of semiconductor devices such as VLSIs and ICs, the occurrence of dust in workrooms is a serious obstruction to the desired high yield of semiconductor devices. That is, the yield of the semiconductor devices is severely influenced by the cleanliness of the workroom's atmosphere. Therefore, semiconductor devices are, generally, processed in clean rooms having a cleanliness level (i.e., the number of dust particles contained in a unit volume of atmosphere) lower than a predetermined level.

In order to eliminate dust completely from a clean room, it is preferred to automate as many processing apparatuses and transfer systems in the clean room as possible. For this reason, several kinds of transporting robots for conveying semiconductor wafers have been used in clean rooms so far. One of these conventional robots has a robot body transferrable along a guide rail disposed in the clean room (K. Satoh, Reduction of Labor and Automation, June issue, p. 43 to 47 (1985)). The robot body includes a clamping hand, the position of which is adapted to be controlled by arm assemblies. This robot can releasably clamp a wafer-encasing cassette with a pair of fingers of the clamping hand and can transport the cassette to a desired place. However, with the above-mentioned conventional robot, manual handling of the cassette is necessary in order to load the cassette into a semiconductor processing apparatus when the processing apparatus requires the cassette to be oriented in a specific direction substantially different from the direction in which the cassette faces during its transportation.

SUMMARY OF THE INVENTION

Accordingly, it is an object of the present invention to provide a transporting robot which can control the orientation of a wafer cassette. (i.e., the orientation of semiconductor wafers in the cassette) without manual assist and thus enables the automatic loading and unloading of the wafer cassette in and from a semiconductor apparatus.

Another object of the present invention is to provide a transporting robot which is capable of clamping a wafer cassette with a pair of fingers in such a manner that the cassette is prevented from falling out of the clamping fingers even if the fingers are turned to control the orientation of the clamped cassette.

A further object of the present invention is to provide a transporting robot in which vibration caused by the sliding movement of the robot body is prevented from transferring to the finger-clamped wafer cassette, whereby the semiconductor wafers in the cassette are prevented from being damaged.

A still further object of the present invention is to provide a transporting robot in which dust produced by the sliding movement of the robot body is prevented from blowing through the clean room, thereby enhancing the cleanliness of the clean room.

With these and other objects in view, the present invention provides a transporting robot including: a guide rail disposed in a clean room; a robot body slidably connected to the guide rail for movement along the guide rail; and first drive means for driving the robot body along the guide rail. The robot body comprises: clamping means for releasably clamping a wafer cassette; an arm assembly, extending between the guide rail and the clamping means, for controlling the position of the clamping means; and a wrist assembly, interposed between the ar assembly and the clamping means, for adjusting the orientation of the clamping means. The wrist assembly comprises: a wrist frame connected via a horizontal pivot to the arm assembly for upward and downward movement, the wrist frame rotatably supporting the clamping means for turning about an axis perpendicular to the horizontal pivot; second drive means for pivoting the wrist frame relative to the arm assembly; and third drive means for turning the clamping means relative to the wrist frame. The wafer cassette can be oriented in the desired direction by pivoting the wrist frame and by turning the clamping means. Accordingly, the robot makes it possible to load and unload wafer cassettes into and from many types of semiconductor processing apparatuses without manual labour.

It is preferred that the clamping means comprises: a hand frame rotatably connected to the wrist frame; a pair of spaced parallel fingers movably connected to the hand frame for movement toward and away from each other; and fourth drive means for moving the fingers. Each of the fingers may have nonslipping means including an engaging projection adapted to be engaged with a periphery of a recessed portion of the wafer cassette so that the wafer cassette is prevented from falling from the fingers.

Each of the fingers may include the resilient damper member interposed between the frame of the finger and the contacting member adapted to directly contact with the cassette. During the transference of the robot body, the damper member dampens the vibration which occurs due to movement of the robot body so that the wafer cassette clamped by the robot's fingers is not subjected to the vibration. Consequently the semiconductor wafers in the cassette are prevented from being damaged by their own pitching movement due to the vibration.

The robot may comprise a tubular enclosure of the guide rail, and an air intake duct in communication with the inside of the enclosure. The enclosure has a slender opening extending along it and allowing the robot body to pass out of the enclosure therethrough. The air intake duct draws air thereinto from the inside of the enclosure so that dust produced inside the enclosure is prevented from blowing out of the enclosure.

BRIEF DESCRIPTION OF THE DRAWINGS

In the drawings:

FIG. 16 is an enlarged sectional view of a proximal end portion of the transporting robot in FIG. 15, the proximal end portion including an enclosure, a guide rail, a sliding arm, air intake duct and the like.

DETAILED DESCRIPTION OF THE PREFERRED EMBODIMENTS

Figure 1:
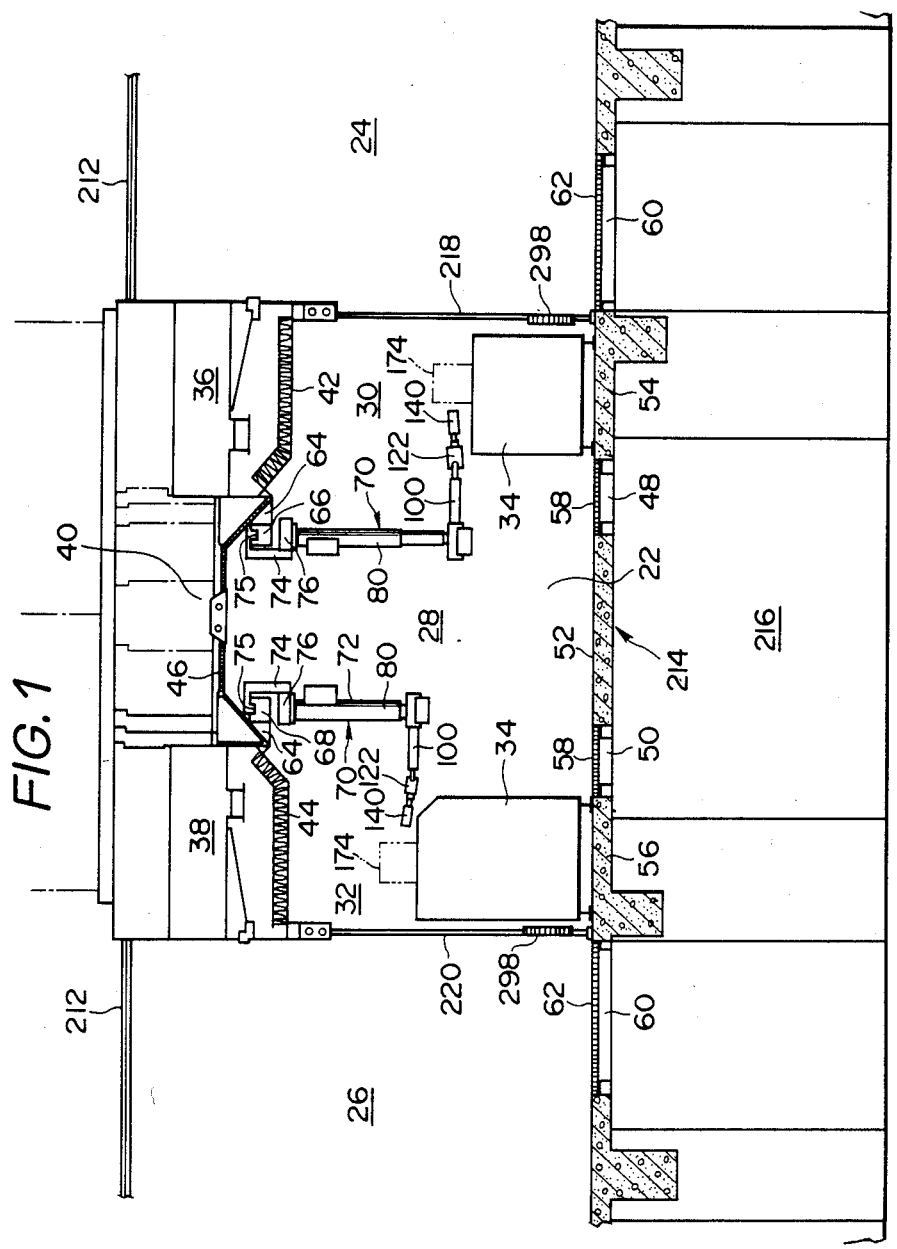
FIG. 1 is a schematic sectional view of a clean room in which transporting robots according to the present invention are installed.

Referring now to the drawings, wherein like reference characters designate corresponding parts throughout several views, and descriptions of the corresponding parts are omitted once given.

FIG. 1 illustrates a clean room of partial laminar flow type, in which there is installed a transporting robot for semiconductor wafers, according to the present invention. In this drawing, reference numeral 212 and 214 designate a ceiling board and a floor board respectively. These ceiling and floor boards 212 and 214 define therebetween an indoor space. The floor board 214 defines thereunder a free access floor 216 in cooperation with a lower floor slab (not shown). The indoor space between the ceiling and floor boards 212 and 214 is divided by two partition plates 218 and 220 into a workroom 22 and two utility rooms 24 and 26. The utility rooms 24 and 26 are arranged on both sides of the workroom 22. The workroom 22 extends straight in a direction perpendicular to the paper surface of FIG. 1 and includes a passage area 28 and two installing areas 30 and 32. The passage area 28 extends along the longitudinal center line of the workroom 22 and serves as a passage for workers. On the other hand, the installing areas 30 and 32 extend along the partition plates 218 and 220 and serve as regions in which processing apparatuses 34 for semiconductor wafers are aligned.

On the ceiling board 212 over the installing areas 30 and 32, there are provided air-supplying chambers 36 and 38 extending parallel to the workroom 22. While, on the ceiling board 212 over the passage area 28, there is provided an air exit 40, that is, the air exit 40 is located between the air-supplying chambers 36 and 38. The air-supplying chambers 36 and 38 are in communication with the workroom 22 through ULPA or HEPA filters 42 and 44 which are disposed respectively on the lower wall defining the air-supplying chambers 36 and 38. Those portions of the filters 42 and 44 adjoined to the air exit 40 are inclined toward the air exit 40 so that the lower surfaces of the filters 42 and 44 are smoothly consecutive with the lower surface of a louver 46 provided at the air exit 40.

The floor board 214 is of a stable construction made of concrete, and has elongated openings 48 and 50 extending along the alignments of the processing apparatuses 34. These openings 48 and 50 divide the floor board 214 into a part 52 to be the floor of passage area 28 and parts 54 and 56 to be the floors of installing areas 30 and 32. The elongated openings 48 and 50 are covered by panels 58 with many apertures, such as gratings or punched metal panels. In addition, reference numeral 60 designates elongated openings formed in the floor of utility rooms 24 and 26 which are covered also by the punched panels 62. That is to say, the workroom 22 is in communication with the utility rooms 24 and 26 through the free access floor 216. Also, reference numeral 298 denotes air outlets provided with louvers. These air outlets 298 allow air in the workroom 22 to go directly into the utility rooms 24 and 26 therethough, thereby preventing air from staying behind the processing apparatusés 34.

Between the air exit 40 and the air-supplying chambers 36 and 38, there are aligned at horizontal spacings, a plurality of supporting members 64 which support a pair of horizontal guide rails 66 and 68 extending respectively along the air-supplying chambers 36 and 38. Each of these guide rails 66 and 68 constitutes a primary conductive body of a linear motor (i.e., the first drive means) 75 of the transporting robot 70 hereinafter described. That is, a robot body 72 of the transporting robot 70 depends from each of the guide rails 66 and 68. The robot body 72 has a sliding arm 74 slidably engaging with the corresponding guide rail 66 or 68 for movement along the guide rail. This sliding arm 74 constitutes a secondary conductive body of the linear motor 75, whereby the robot body 72 is transferred along the corresponding guide rail.

Figure 2:
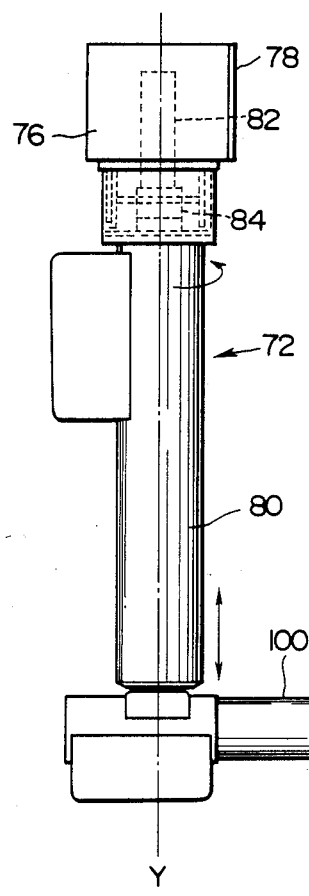
FIG. 2 is a side-elevational view of a robot body in FIG. 1.

As shown in FIG. 2, a vertical arm 80 depends from a hollow mount base 76 which is connected via a flange 78 to the sliding arm 74. This vertical arm 80 is rotatably connected at its upper end to the mount base 76 for turning about its axis Y. A motor 82 is secured to the mount base 76 and is connected to the gear on the vertical arm 80 via reduction gears 84. That is, the motor 82 and the reduction gears 84 constitute the fifth drive means, that is, a mechanism for turning the vertical arm 80 relative to the mount base 76. The motor 82 is a dc motor having a rotary encoder and an electromagnetic brake. The electromagnetic brake is of a type which brakes the motor 82 when it is de-energized, while reduction gears 84 are harmonic reduction gears having a harmonic drive system, which are a kind of differential gear mechanism.

Figure 4:
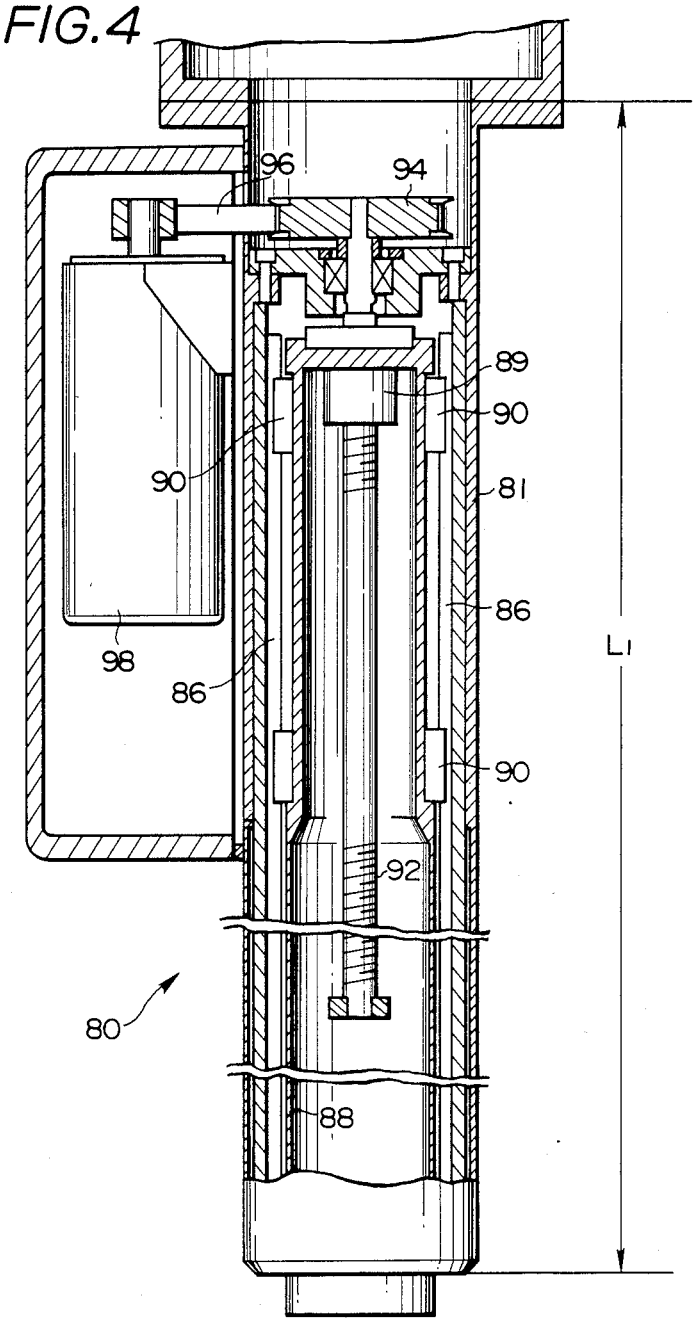
FIG. 4 is a vertical sectional view of a vertical arm in FIG. 2.

As shown in FIG. 4, the vertical arm 80 includes an outer tubular frame 81 and an inner telescoping tube 88. A plurality of guide members 86 extend vertically through the tubular frame 81. The telescoping tube 88 is coaxially received in the tubular frame 81 and is slidably connected via its slider portions 90 to the guide members 86 for vertical sliding movement. This telescoping tube 88 has a ball nut 89 at its proximal end. A lead screw 92 which is rotatably supported by the tubular frame 81 is threadedly engaged with the ball nut 89. The lead screw 92 is provided at its upper end with a pulley 94 which is connected via a belt 96 to a drive motor 98 secured to the outer face of the tubular frame 81. The belt 96 comprises a timing belt so that the belt 96 does not slip about the pulley 94 when it is driven by the motor 98. Consequently, when the motor 98 is actuated, the telescoping tube 88 moves upward and downward relative to the tubular frame 81. In other words, the vertical arm 80 is vertically extensible and retractable. For example, the length $L_1$ of the tubular frame 81 is 800 mm, and the range of sliding movement of the telescoping tube 88 is 400 mm.

Figure 5:
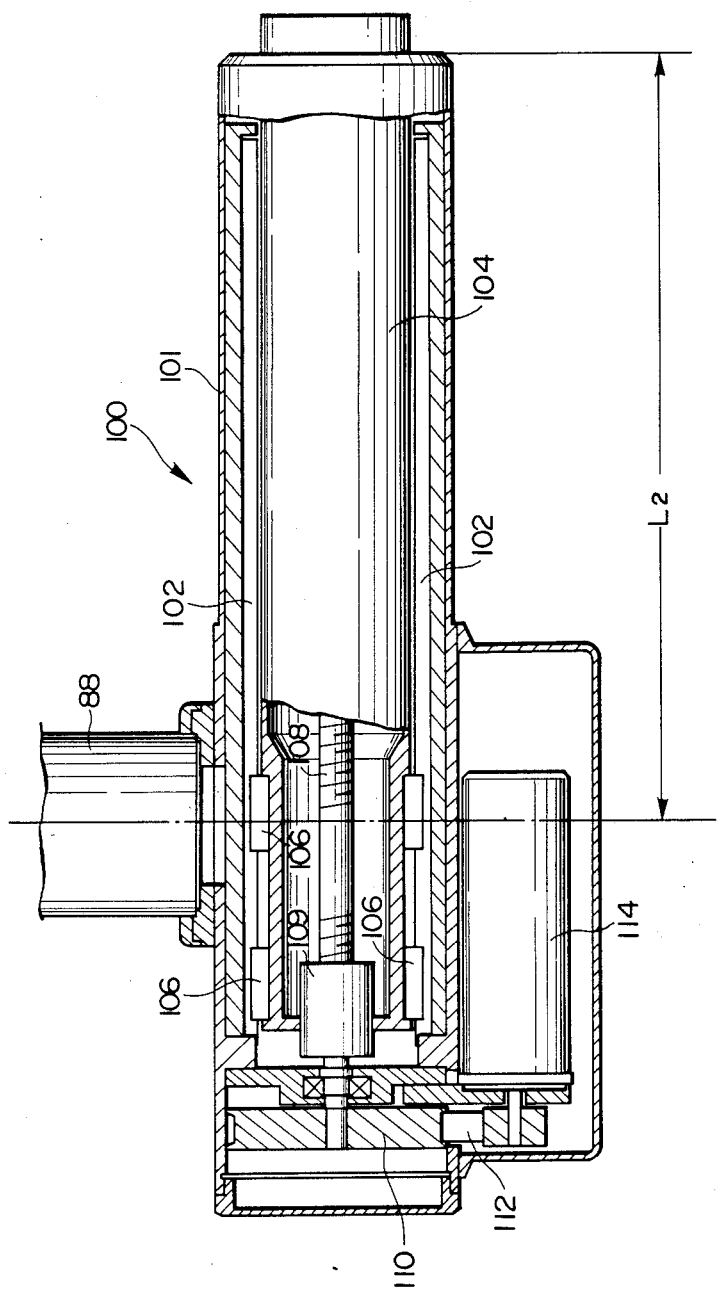
FIG. 5. is a vertical sectional view of a horizontal arm in FIG. 2.

As illustrated in FIG. 5, a horizontal arm 100 extends horizontally from the lower end of the telescoping tube 88. This horizontal arm also includes an outer tubular frame 101 and an inner telescoping tube 104. The tubular frame 101 has a plurality of guide members 102 extending horizontally therethrough. The telescoping tube 104 is coaxially disposed in the tubular frame 101 and is slidably connected to the guide members 102 via its slider portions 106 for horizontal sliding movement. A lead screw 108 is rotatably connected to the tubular frame 101 and is threadedly engaged with a ball nut 109 of the telescoping tube 104 in the same manner as the lead screw 92 of the vertical arm 80. A pulley 110 is attached at the proximal end of the lead screw 108 to connect the lead screw 108 via a timing belt 112 to a drive motor 114 which is secured to the outer face of the tubular frame 101. With this construction, the horizontal arm 100 extends and retracts horizontally by actuating the drive motor 114. For example, the length $L_2$ of the tubular frame 101, that is, the distance from the center of the vertical arm 80 to the distal end of the tubular frame 101 is 390 mm, and the range of sliding movement of the telescoping tube 104 is 300 mm.

Figure 3:
FIG. 3 is a fragmentary plan view of the robot body in FIG. 2.
Figure 6:
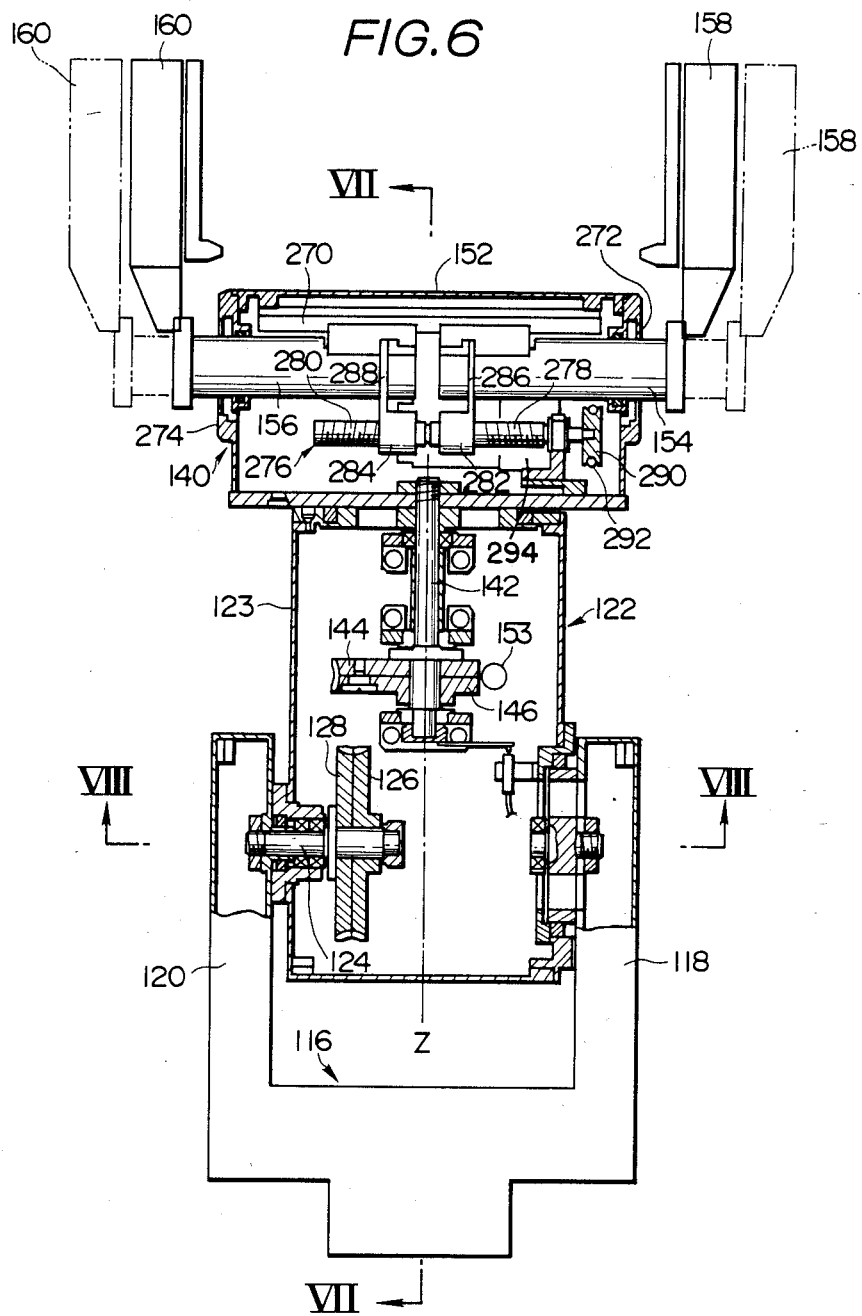
FIG. 6 is a plan view, partly in section, of a distal end portion of the robot body in FIG. 2, the distal end portion including a bracket, a wrist and a clamping hand.
Figures 7, 8:
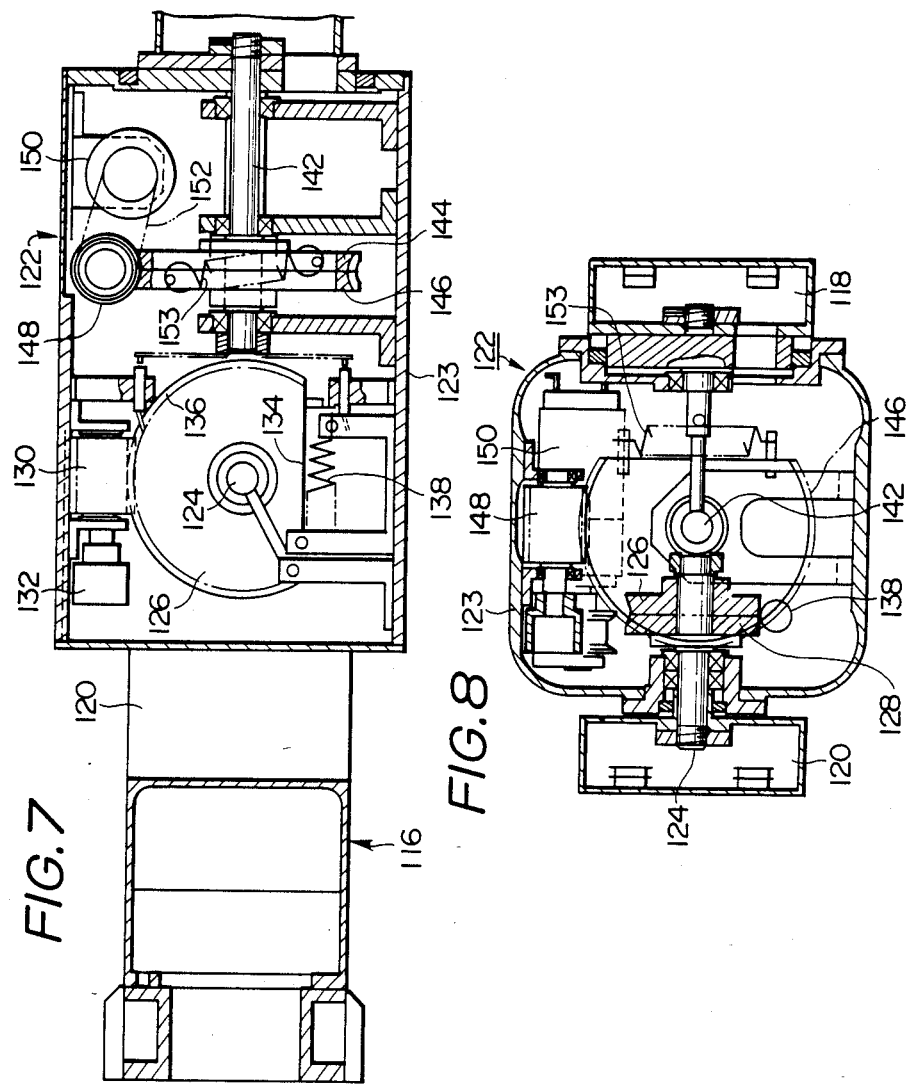
FIG. 7 is a fragmentary view taken along the line VII—VII in FIG. 6.
FIG. 8 is a view taken along the line VIII—VIII in FIG. 6.

As illustrated in FIG. 3, the telescoping tube 104 is provided at its distal end with a bracket 116 which has a pair of spaced parallel side bars 118 and 120 extending forward. A wrist 122 is interposed between both the side bars 118 and 120. As shown in FIG. 6, the wrist 122 includes a generally rectangular hollow frame 123 that is connected by a pivot 124 to the side bars 118 and 120 for upward and downward movement. A pair of worm wheels 126 and 128 adjoined to each other are coaxially attached to that portion of the pivot 124 inside the wrist frame 123. As shown in FIG. 7, each of the worm wheels 126 and 128 is of a noncircular shape as if a circular worm wheel were intercepted by a horizontal line intersecting the worm wheel at a level of a quarter of the diameter of the worm wheel. In other words, each worm wheel has a straight peripheral portion 134 and an arcuate peripheral portion 136 provided with teeth (not shown). A worm 130 which is rotatably connected to the wrist frame 123 is meshed with the worm wheels 126 and 128, and the worm 130 is drivingly connected to a servomotor 132 which is secured to the wrist frame 123. In addition, a coil spring 138 is attached at its opposite ends respectively to the worm wheels 126 and 128 so that the worm wheels 126 and 128 are urged in the reverse circular directions, whereby the backlash between the worm 130 and worm wheels is eliminated. By operating the servomotor 132, the worm 130 moves along the arcuate peripheral portions 136 of the worm wheels 126 and 128, which results in pivoting movement of the wrist 122.

Returning to FIG. 6, the longitudinal axis Z of the wrist frame 123 extends perpendicular to the pivot 124. At the distal end of the wrist frame 123, a clamping hand 140 is rotatably connected for turning about a shaft 142 coincidental with the longitudinal axis Z of the wrist frame 123. The distal end portion of the shaft 142 is secured to the clamping hand 140, while the proximal end portion of the shaft 142 is rotatably received in the wrist frame 123. As shown in FIGS. 7 and 8, a pair of adjoining worm wheels 144 and 146 having the same shape as the worm wheels 126 or 128 are attached to the proximal end portion of the shaft 142. A worm 148 that is rotatably supported by the wrist frame 123 is meshed with the worm wheels 144 and 146. The worm 148 is connected by means of timing belt 152 to a servomotor 150 which is secured to the wrist frame 123. A coil spring 153 is attached at its opposite ends to the worm wheels 144 and 146 so that the backlash between the worm 148 and worm wheels 144 and 146 is eliminated. When the servomotor is turned on, the worm 148 is rotated, which causes the clamping hand 140 to turn about the shaft 142.

Returning again to FIG. 6, the clamping hand 140 includes a substantially rectangular hand frame 152 of a hollow construction which is secured to the shaft 142. The hand frame 152 has a guide member 270 extending between the opposite side walls 272 and 274 of the hand frame 152. A pair of sliding rods 154 and 156 pass respectively through the side walls 272 and 274 of the hand frame 152, and are slidably connected to the guide member 270 for movement along the guide member 270, that is, movement in a direction perpendicular to the shaft 142. Also in the hand frame 152, a lead screw 276 is disposed parallel to the guide member 270, and is rotatably supported by the hand frame 152. This lead screw 276 includes a first end portion 278 provided with a thread and a second end portion 280 provided with another thread runs in reverse helical direction to the thread on the first end portion 278. The first and second end portions 278 and 280 of the lead screw 276 are engaged with ball nuts 282 and 284 respectively. These ball nuts 282 and 284 are connected respectively to the sliding rods 154 and 156 via connecting arms 286 and 288. The lead screw 276 has a pulley 290 which is connected via a belt 292 to a servomotor 294.

Figure 9:
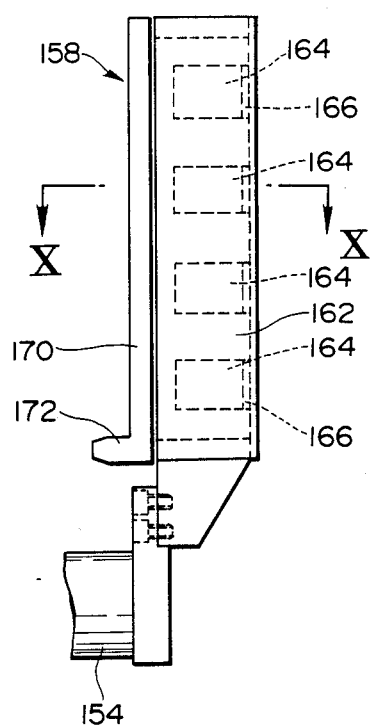
FIG. 9 is an enlarged plan view of a finger in FIG. 6.
Figure 10:
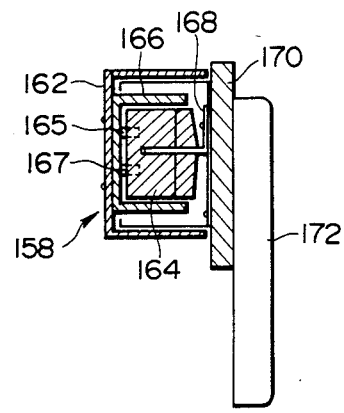
FIG. 10 is a view taken along the line X—X in FIG. 9.
Figure 11:
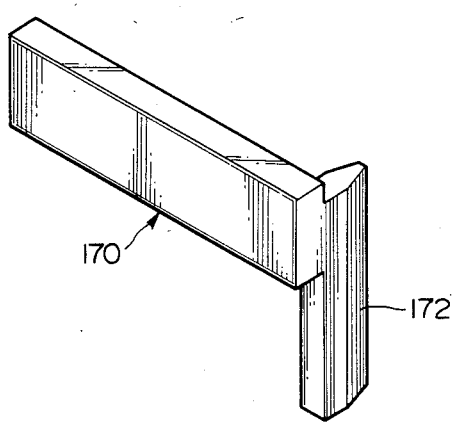
FIG. 11 is an enlarged perspective view of a contacting slip in FIG. 6.

A pair of fingers 158 and 160 are attached respectively to the outer ends of the sliding rods 154 and 156, and extend parallel to the shaft 142. As shown in FIGS. 9 and 10, each of the fingers 158 and 160 includes a channel-like finger frame 162 secured at its proximal end to the corresponding sliding rod with its opening open toward the mating finger. Four rectangular damper members 164 are attached via channel-shaped brackets 166 to the inner face of the finger frame 162 at equal longitudinal spacings. The damper members are made of a resilient material such as a natural rubber, synthetic resin and the like. Reference numerals 165 and 167 in FIG. 10 designate pins securing the damper members 164 to the brackets 166. An L-shaped mount bracket 168 is embedded at one of its end portions in each of the damper members 164. A contacting slip 170 that is adapted to directly contact with the cassette, is secured by means of a plurality of screws to the other end portions of the L-shaped mount brackets 168 in such a manner that the contacting slip 170 almost closes the opening of the finger frame 162 but does not directly make contact with the finger frame 162. As shown in FIGS. 9 and 10, the contacting slip 170 has an engaging projection 172 protruding inward from the proximal end of the contacting slip 170. This engaging projection 172 may, as shown in FIGS. 10 and 11, extend in a direction perpendicular to both the contacting slip 170 and the sliding rods 154 and 156. When the servomotor 294 is actuated, the lead screw 276 is rotated about its axis. The rotation of the lead screw 276 causes the fingers 158 and 160 to move toward and away from each other as indicated by solid and phantom lines in FIG. 6.

The operation of the transporting robot thus constructed will now be described.

To load a wafer cassette in a predetermined semiconductor processing apparatus, the linear motor 75 of the corresponding robot 70 is actuated, whereby the robot body 72 is transferred along the guide rail 66 or 68 to a storage compartment in which wafer cassettes are stored. The vertical and horizontal arms 80 and 100 and the wrist 122 are operated to position the clamping hand 140 in front of a predetermined wafer cassette.

Figure 12:
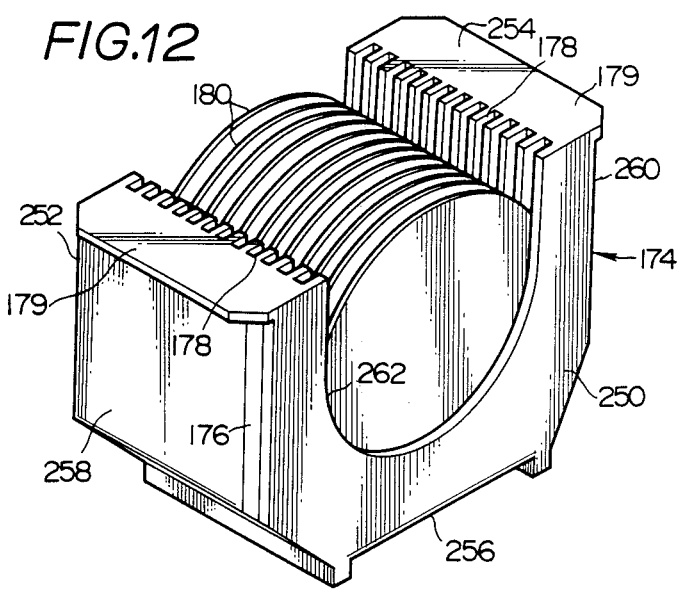
FIG. 12 is a perspective view of a wafer cassette in which a plurality of semiconductor wafers are contained.

As shown in FIG. 12, the wafer cassette 174 to be handled by the robot 70 is of a channel-shaped structure having, U-shaped opposite end faces 250 and 252, open top face 254, closed bottom face 256, opposite side faces 258 and 260 and inner face 262. A plurality of groove-like compartments 178 are formed in the inner face 262 of the cassette 174 in such a manner that semiconductor wafers 180 are aligned in series parallel to the end faces 250 and 252 when the wafers 180 are received in the compartments 178. A pair of flange portions 179 project sideward respectively from the upper edges of the side faces 258 and 260. Also, a recessed portion or a groove 176 is formed in that portion of each of the side faces 258 and 260 adjacent to the end face 250 in such a manner that the groove 176 extends perpendicular to the top face 254. The wafers 180 can be put into and taken out of the compartments 178 through the opening at the top face 254.

Figure 13:
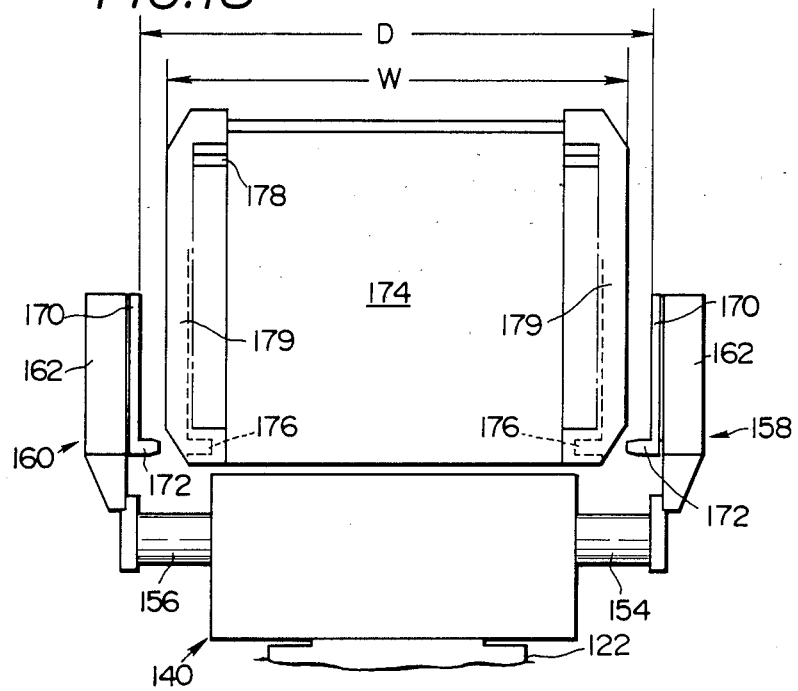
FIG. 13 is a plan view of a clamping hand in FIG. 6 with a wafer cassette positioned between the fingers of the clamping hand.

After positioning the clamping hand 140 in front of the wafer cassette 174, the fingers 158 and 160 of the clamping hand 140 are withdrawn away from each other, as shown in FIG. 13, until the distance D between the fingers 158 and 160 exceeds the width W of the cassette 174. The clamping hand 140 is then moved forward so that the wafer cassette 174 is positioned between the fingers 158 and 160, and thereafter, the fingers 158 and 160 are moved toward each other until they contact respectively with the opposite side faces 258 and 260 of the wafer cassette 174 to clamp the cassette 174. At the same time as the cassette 174 is clamped, the engaging projections 172 of the fingers are engaged with those portions of cassette 174 defining the grooves 176. The clamping hand 140 is then moved upward to lift the wafer cassette 174. Since the contacting slips 170 of the fingers engage with flange portions 179 of the cassette 174, the cassette 174 does not fall from the clamping hand 140 upon the lifting movement of the clamping hand 140. In addition, the cassette 174 is lifted in such a state that the top face 254 of the cassette 174 faces upward, that is, the wafers 180 inside the cassette 174 are in vertical position. After that, the wrist 122 is pivoted so that the semiconductor wafers 180 are inclined about 10° to a vertical plane. Upon the pivoting movement of the wrist 122, the engaging projections 172 prevent the cassette 174 from falling from the fingers 158 and 160. The robot body 72 is then transferred together with the wafer cassette 174 to a position in front of a semiconductor processing apparatus.

During the transference of the robot body 72, the entire robot 70 vibrates slightly due to its movement. However the vibration does not reach the wafer cassette 174 almost at all since the damper members 164 dampen the vibration. Also, during the transference of the robot body 72, since the semiconductor wafers 180 in the cassette 174 are inclined to a vertical plane, each of the wafers 180 leans against the wall of the corresponding compartment 178 of the cassette 174, and thus is held stably in the compartment 178. For these reasons, during the transport of the cassette 174, the semiconductor wafers 180 neither are damaged due to their pitching movement nor produce dust due to the damage such as abrasion.

Most of the wafer processing apparatuses require a cassette to be oriented in a specific direction when the cassette is loaded into the processing apparatuses. For this reason, the cassette 174 must sometimes be turned to change its orientation. For example, in order to orient the top face 254 of the cassette 174 sideward, the wrist 122 is pivoted from the position shown by the solid line in FIG. 2 to the position shown by the phantom line. The orientation of the cassette 174 can further be changed by turning the clamping hand 140 relative to the wrist 122. During the pivoting of the cassette 174, the engagement between the engaging projection 172 and the cassette 174 prevents the cassette from falling from the fingers 158 and 160. The clamping hand 140 is then positioned adjacent to the loading port of the processing apparatus, and thereafter the fingers 158 and 160 are moved away from each other so as to release the cassette.

To unload a wafer cassette from a processing apparatus and to transport the same to another apparatus or storage compartment, a similar operation to that described above is achieved by the transporting robot.

Figure 14:
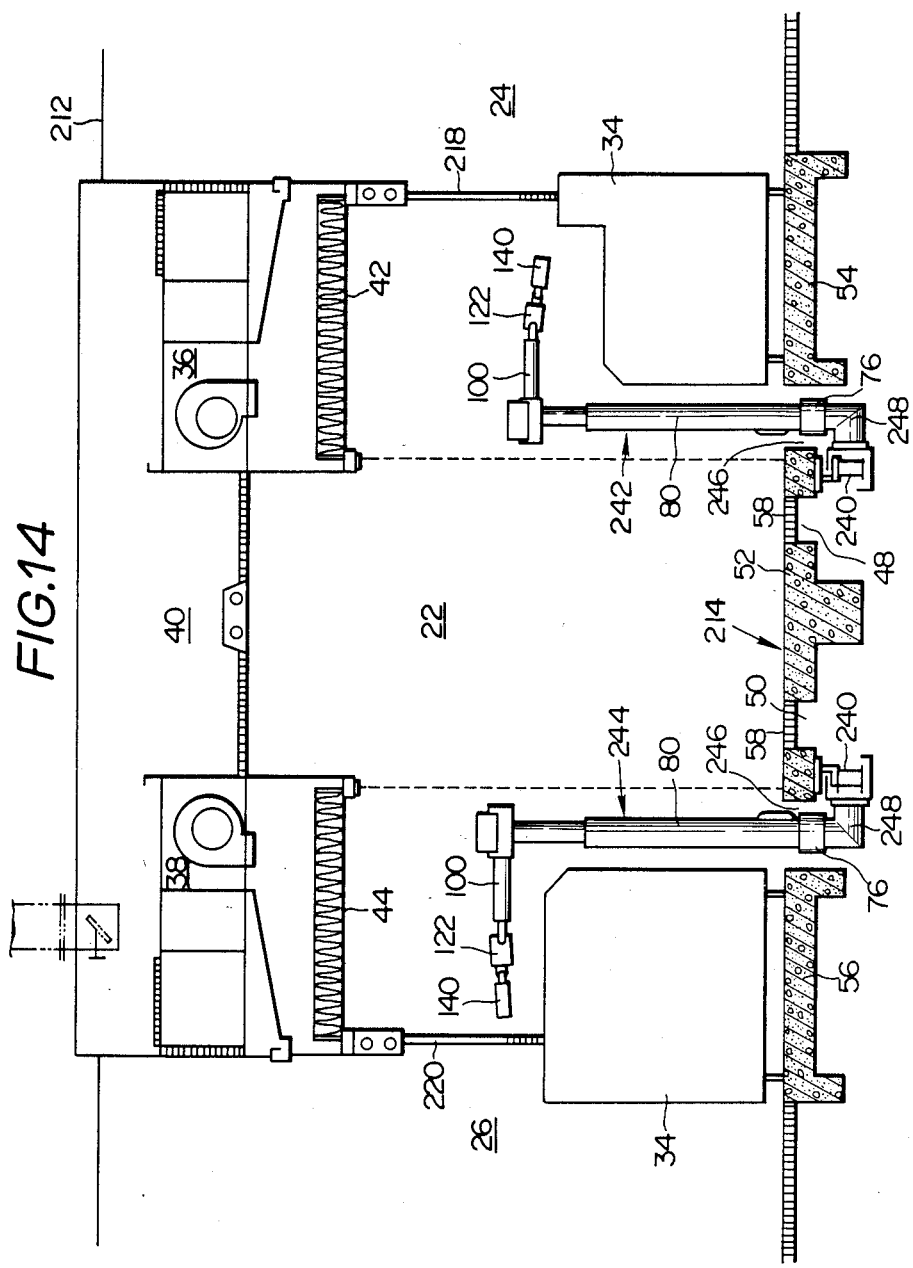
FIG. 14 is a schematic sectional view of a clean room in which a modified form of the transporting robot in FIG. 1 is installed.

FIG. 14 illustrates a modified form of the transporting robot in FIG. 1. The guide rail 240 of each of robots 242 and 244 of this modified form is disposed under the floor board 214. More specifically, the guide rail 240 is attached to the lower face of the floor 52 of the passage areas 28, along the opposite side edges of the floor 52. An elongated opening 246 is formed in each of the floors 54 and 56 at a location between the processing apparatus 34 and the guide rail 240, and extends along the alignment of the processing apparatuses 34. An L-shaped sliding arm 248 is slidably engaged at its lower end with the guide rail 240, the upper end of the sliding arm 248 facing to the elongated opening 246. The mount base 76 and the vertical arm 80 are assembled on the upper end of the sliding arm 248, and extend upward through the elongated opening 246 over the floor board 214. The horizontal arm 100 is connected to the upper end of the vertical arm 80, and the wrist 122 and the clamping hand 140 are connected to the distal end of the horizontal arm 100. That is to say, the robot body 72 in FIG. 1 is used in the inverted manner in FIG. 14.

Figure 15:
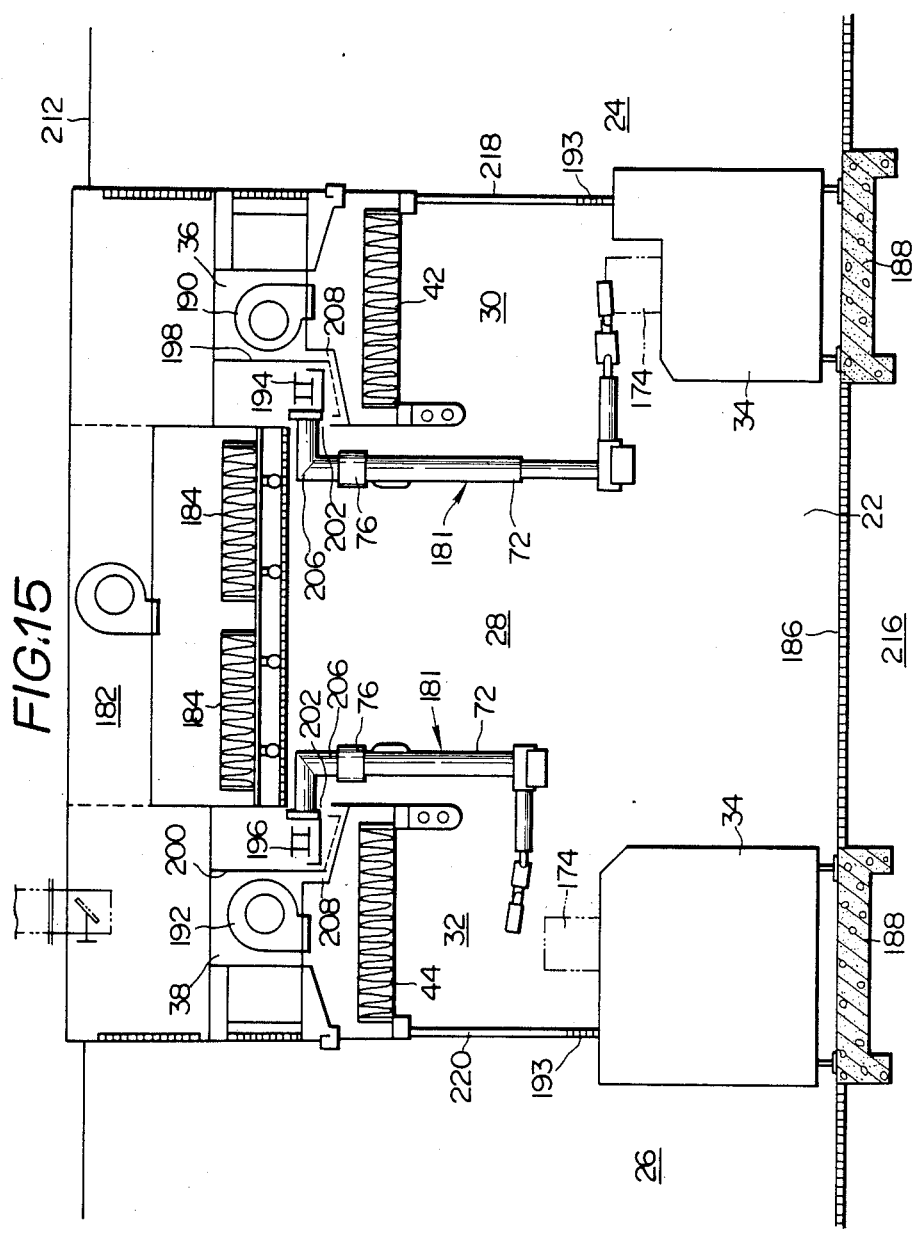
FIG. 15 is a schematic sectional view of a clean room in which another embodiment of the transporting robot in FIG. 1 is installed.

Another embodiment of the present invention is illustrated in FIG. 15. A transporting robot 181 of this embodiment is designed to be used in a clean room in which air-supplying chambers are provided not only on the ceiling board 212 over the installing areas 30 and 32 but also on the ceiling board over the passage area 28. More specifically, over the passage area 28, there is provided an air-supplying chamber 182 which is in communication with the workroom 22 through a HEPA or ULPA filter 184 attached to the lower wall of the air-supplying chamber 182. The floor 186 of the passage area 28 is constituted of a plurality of punched panels, while on the other hand, the floors 188 of the installing areas 30 and 32 are made of concrete structures. The reference numerals 190 and 192 denote blowers which drive a current of air into the workroom 22.

In this clean room, air blown into the workroom 22 through the filters 42, 44 and 184 flows downwards to the floor 186, and passes out of the workroom 22 through the punched panels 186 into the free access floor 216. A part of the air stream in the workroom 22 flows into the utility rooms 24 and 26 through air outlets 193 at the lower portions of the partition plates 218 and 220. That is, the air outlets 193 prevent air from staying around the processing apparatuses 34.

Figure 16:
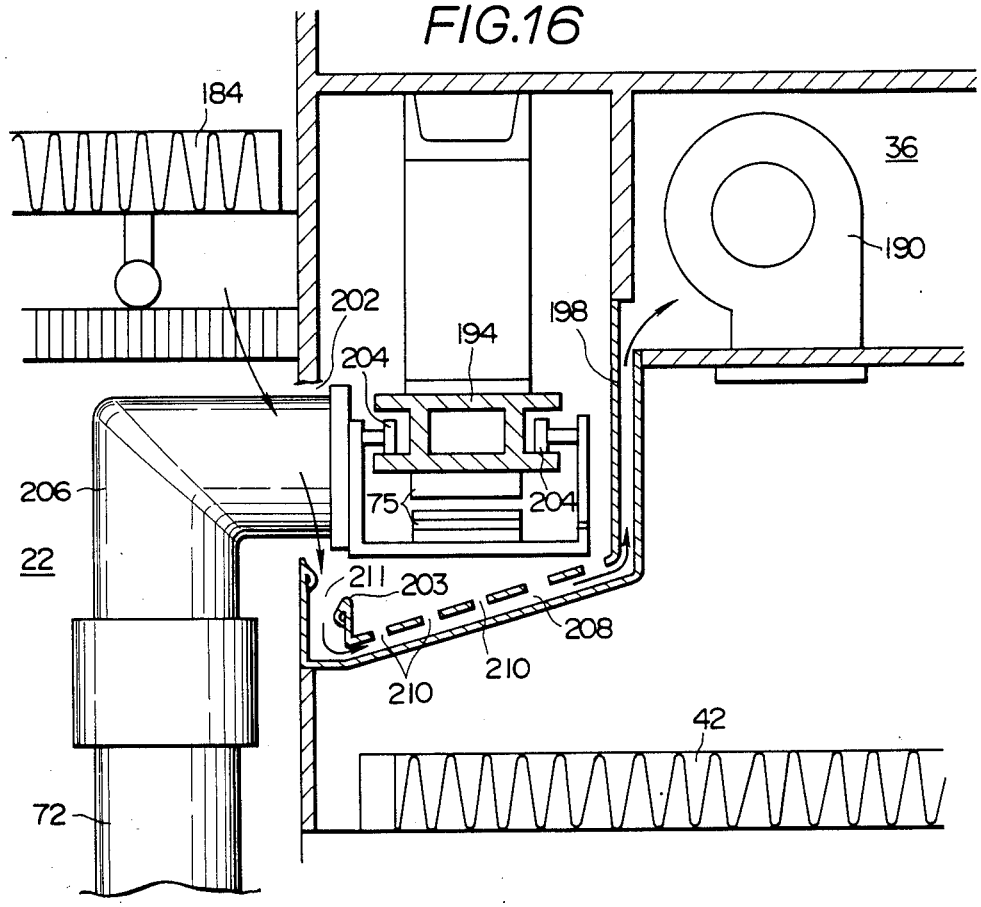

The robot 181 of this embodiment has a tubular enclosure enclosing the entire length of its guide rail. As shown in FIG. 15, the enclosures 198 and 200 are interposed between the air-supplying chamber 182 and the respective air-supplying chambers 36 and 38, and extend respectively along the chambers 36 and 38. The guide rails 194 and 196 of the robots are disposed respectively within the enclosures 198 and 200. Each of the enclosures 198 and 200 is provided on its side wall with a slender opening 202 opening sideward and extending along the entire length of the enclosure. A sliding arm 206 which engages with each of the guide rails 194 and 196 via rollers 204 (see FIG. 16), passes out of the corresponding enclosures 198 or 200 through the slender opening 202 so as to slidably connect the robot body 72 to the guide rail. An air intake duct 208 is disposed along the lower outer surface of each of the enclosures 198 and 200 in such a manner that the slender opening 202 of the corresponding enclosure is in communication, by means of the air intake duct 208, with the corresponding air-supplying chamber 36 or 38 which has a negative pressure. As shown in FIG. 16, the duct 208 has a suction opening 211 which opens upward along the lower edge 203 of the slender opening 202 of the corresponding enclosure, thus, as indicated by the arrow in FIG. 16, a part of the air blown from the air filter 184 into the workroom 22 is drawn into the air intake duct 208 through the suction opening 211 of the duct 208. This laminar flow of air from the filter 184 to the suction opening 211 forms an air curtain substantially covering the slender opening 202 of the enclosure. Therefore, this air curtain prevents dust produced in the enclosure due to the sliding movement of sliding arm 206 from blowing out of the enclosure 198 (or 200). Also, since the air curtain partitions the inside of the enclosure from the workroom 22, it prevents occurrence of a turbulent flow of air in the vicinity of the slender opening 202 of the enclosure, whereby the cleanliness of the clean room is enhanced. In addition, the dust produced in the enclosure 198 or 200 is drawn into the duct 208 through a plurality of slits 210 formed in the lower portion of the wall of the enclosure 198, and is transferred into the corresponding air-supplying chamber.

It is preferred that the width of the suction opening 211 of the air intake duct 208 is smaller than that of the main part of the duct 208 s that the rate of air flow drawn into the duct 208 is enhanced. Although the duct 208 in FIGS. 15 and 16 is inclined to a horizontal plane, an air intake duct horizontally extending or inclined in the opposite manner to the one in FIGS. 15 and 16 may be employed in place of the duct 208.

What is claimed is:

1. A transporting robot for semiconductor wafers contained in a wafer cassette, the robot being used in a clean room in which a laminar flow of air moves downward from an air-supplying means of the clean room, the robot comprising: a guide rail disposed substantially horizontally under the air-supplying means of the clean room; a robot body depending from the gude rail and slidably connected to the guide rail for movement along the guide rail; first drive means for driving the robot body along the guide rail; a tubular enclosure enclosing the entire length of the guide rail; and suction means for drawing the air thereinto from the inside of the enclosure so that dust produced inside the enclosure is prevented from blowing out of the enclosure, said robot body comprising:

clamping means for releasably clamping the wafer cassette;

an arm assembly, extending between the guide rail and the clamping means, for controlling the position of the clamping means; and a wrist assembly, interposed between the arm assembly and the clamping means, for adjusting the orientation of the clamping means, said wrist assembly comprising:

a) a wrist frame connected via a horizontal pivot to the arm assembly for upward and downward movement, the wrist frame rotatably supporting the clamping means for turning movement of the clamping means about a shaft perpendicular to said horizontal pivot;

b) second drive means for pivoting the wrist frame relative to the arm assembly; and c) third drive means for turning the clamping means relative to the wrist frame, said enclosure having a slender opening extending therealong and opening sideward, the slender opening allowing the robot body to pass out of the enclosure therethrough, said suction means comprising an air intake duct in communication with the inside of the enclosure, the air intake duct having a suction opening which opens upward at the lower edge of the slender opening of the enclosure so that an air flow directed to the suction opening forms an air curtain covering the slender opening of the enclosure, whereby dust produced in the enclosure is prevented from blowing out of the enclosure through the slender opening.

2. A transporting robot according to claim 1, wherein the clamping means comprises: a hand frame rotatably connected to the wrist frame; a pair of spaced parallel fingers adapted to releasably clamp the wafer cassette therebetween, the fingers movably connected to the hand frame for movement toward and away from each other; and fourth drive means for moving the fingers, each of said fingers comprising nonslipping means for preventing the wafer cassette from falling from the fingers.

3. A transporting robot according to claim 2, wherein the nonslipping means comprises an engaging projection adapted to be engaged with a periphery of a recessed portion of the wafer cassette; the engaging projection protruding from each of the fingers toward the confronting finger.

4. A transporting robot according to claim 3, wherein the arm assembly comprises: a sliding arm slidably connected to the guide rail; an extendable vertical arm rotatably connected to the sliding arm for turning about a longitudinal axis thereof, and including means to extend and retract said vertical arm; fifth drive means for turning the vertical arm relative to the sliding arm; and an extendable horizontal arm extending between the vertical arm and the wrist assembly, and including means to extend and retract said horizontal arm.

5. A transporting robot according to claim 2, wherein each of the fingers further comprises damper means for dampening the vibration due to the sliding movement of the robot body so that the wafer cassette clamped by the fingers is not subjected to the vibration.

6. A transporting robot according to claim 5, wherein each of the fingers further comprises: a finger frame connected to the hand frame; and a contacting member adapted to directly contact with the wafer cassette, and wherein the damper means is interposed between the finger frame and the contacting member to interconnect the finger frame and the contacting member, the damper means comprising a resilient member.

7. A transporting robot according to claim 1, wherein the clamping means comprises:
a hand frame of a hollow box-like construction having opposite side walls, the hand frame being rotatably connected via the shaft to the wrist frame so that the opposite side walls are generally parallel to the shaft;
a pair of sliding rods disposed in the hand frame so as to be perpendicular to the opposite side walls of the hand frame, the sliding rods having their respectively outer ends passing out of the hand frame respectively through the opposite side walls so as to be movably held respectively by the opposite side walls for movement along their longitudinal axes;
fourth drive means, disposed in the hand frame, for moving the sliding rods toward and away from each other; and
a pair of spaced parallel fingers for releasably clamping the wafer cassette therebetween, the fingers being perpendicularly connected respectively to the outer ends of the sliding rods so that the fingers are moved toward and away from each other by the fourth drive means.

8. A transporting robot according to claim 7, wherein the clamping means further comprises:
a guide member disposed in the hand frame and extending between the opposite end walls, the guide member being connected to the sliding rods to guide the sliding rods in their axial movement;
a lead screw disposed in the hand frame so as to be parallel to the guide member and rotatably supported by the hand frame for rotational movement about its axis, the lead screw being operatively connected to the fourth drive means, the lead screw having first and secured end portions provided respectively with threads, the thread of the first end portion running in reverse helical direction to the thread of the second end portion; and
a pair of ball nuts threadedly engaged respectively with the first and second end portions of the lead screw and fixedly connected respectively to the sliding rods.

9. A transporting robot according to claim 1, wherein:
said clamping means comprises:
i) a hand frame rotatably connected to the wrist frame;
ii) a pair of spaced parallel fingers for releasably clamping the wafer cassette therebetween, the fingers being movably connected to the hand frame for movement toward and away from each other; and
iii) fourth drive means for moving the fingers;
each of said fingers comprising:
i) a channel like finger frame having an open side and closed opposite ends, and connected at one of the opposite ends to the hand frame with the open side of the finger frame facing the other finger;
ii) a contacting member of a slip-like configuration adapted to directly contact the wafer cassette, the contacting member being connected to the finger frame in such a manner that the contacting member does not directly contact the finger frame but substantially closes the open side of the finger frame to prevent dust generated in the finger frame from blowing out of the open side; and
iii) damper means, received in the finger frame and interconnecting the finger frame with the contacting member, for dampening the vibration due to the movement of the robot body along the guide rail so that, when the wafer cassette is clamped by the fingers, the semiconductor wafers in the cassette are not subjected to the vibration.

10. A transporting robot according to claim 9, wherein:
said finger frame includes a bottom wall and a pair of side walls;
the contacting member has a width larger than the distance between the side walls of the finger frame;
the damper means comprises a resilient member of a transverse outer size less than the interval between the contacting member and the bottom wall of the finger frame; and
the clamping means further comprises a connecting bracket interconnecting the resilient member with the contacting member.

11. A transporting robot according to claim 1, wherein said wafer cassette is of a box-like construction having open top, closed bottom and opposite side faces, the side faces having a pair of flange portions projecting sideward respectively from the upper edges thereof, the side faces having a pair of grooves formed therein respectively so as to extend perpendicularly to the upper edges of the side faces, said clamping means comprising:
a hand frame rotatably connected to the wrist frame;
a pair of spaced parallel fingers for releasably clamping the wafer cassette therebetween, the fingers being movably connected to the hand frame for movement toward and away from each other, the fingers engaging respectively with the flange portions of the wafer cassette when the fingers clamp the wafer cassette;
a pair of engaging projections protruding respectively from the fingers toward each other, the engaging projections engaging respectively with those portions of the side faces of the wafer cassette defining the grooves when the fingers clamp the wafer cassette; and
fourth drive means for moving the fingers.

* * * * *

UNITED STATES PATENT AND TRADEMARK OFFICE
CERTIFICATE OF CORRECTION

PATENT NO. : 4,904,153

DATED : February 27, 1990

INVENTOR(S) : Yoshiyuki Iwasawa, et al.

It is certified that error appears in the above-identified patent and that said Letters Patent is hereby corrected as shown below:

```
Column 2, line 11:  "ar"  should read as --arm--
Column 9, line 56:  "s"   should read as --so--
Column 11, line 47, Claim 8:  "secured"  should
read as --second--
```

Signed and Sealed this

Second Day of July, 1991

*Attest:*

HARRY F. MANBECK, JR.

*Attesting Officer*  *Commissioner of Patents and Trademarks*